United States Patent
Chesnut et al.

(10) Patent No.: US 9,904,750 B2
(45) Date of Patent: Feb. 27, 2018

(54) SYSTEM AND METHOD TO PREDICT WHETHER A PROTECTION CIRCUIT IS LIKELY TO PREVENT A LATENT FAILURE WITHIN A MONITORED CIRCUIT

(71) Applicant: The Boeing Company, Chicago, IL (US)

(72) Inventors: Kay Chesnut, Los Angeles, CA (US); Anthony C. Le, El Segundo, CA (US); MaryAnne Dooley, El Segundo, CA (US)

(73) Assignee: THE BOEING COMPANY, Chicago, IL (US)

( * ) Notice: Subject to any disclaimer, the term of this patent is extended or adjusted under 35 U.S.C. 154(b) by 837 days.

(21) Appl. No.: 14/201,420

(22) Filed: Mar. 7, 2014

(65) Prior Publication Data

US 2015/0254385 A1 Sep. 10, 2015

(51) Int. Cl.
| | |
|---|---|
| G06F 17/18 | (2006.01) |
| G06F 17/50 | (2006.01) |
| G01R 31/311 | (2006.01) |
| G01R 31/28 | (2006.01) |

(52) U.S. Cl.
CPC ..... *G06F 17/5036* (2013.01); *G01R 31/2881* (2013.01); *G01R 31/311* (2013.01); *G01R 31/2879* (2013.01)

(58) Field of Classification Search
CPC ............ G01R 31/2881; G01R 31/2879; G01R 31/311; G06F 17/5036
See application file for complete search history.

(56) References Cited

U.S. PATENT DOCUMENTS

| | | | | |
|---|---|---|---|---|
| 6,108,183 A | * | 8/2000 | Beene | H04M 3/18 |
| | | | | 361/103 |
| 2013/0099774 A1 | | 4/2013 | Miller et al. | |

OTHER PUBLICATIONS

A.Y.Nikiforov, V.V.Bykov, V. S.Figurov, A.I.Chumakov, P.K. Skorobogatov and V.A.Telets, "Latch-up Windows Tests in High Temperature Range", 0-7803-4071-W98/$10.00 0 1998 IEEE.*

(Continued)

Primary Examiner — Matthew G Marini
(74) Attorney, Agent, or Firm — Toler Law Group, PC (57) ABSTRACT

A method includes measuring a plurality of latchup release parameter values of a monitored circuit to generate data. Each latchup release parameter value of the plurality of latchup release parameter values is associated with the monitored circuit exiting a latchup state. The method also include predicting, based on the data and based on one or more characteristic values of a protection circuit coupled to the monitored circuit, whether the protection circuit is likely to prevent an occurrence of a latent failure within the monitored circuit in particular latchup conditions.

20 Claims, 5 Drawing Sheets

(56) References Cited

OTHER PUBLICATIONS

International Search Report and Written Opinion of the International Searching Authority for International Application No. PCT/US2015/010989 dated Apr. 16, 2015; (13 pages).
Avery L.R., Beyond MIL HBM Testing—How to Evaluate the Real Capability of Protection Structures; Electrical Overstress/Electrostatic Discharge Symposium Proceeding; Jan. 1, 1991; (8 pgs).
Wang A. Z. et al., On-chip ESD protection design for integrated circuits: an overview for IC designers; Microelectronics Journal, Mackintosh Publications Ltd.; Luton, GB; vol. 32, No. 9; Sep. 1, 2001; (16 pgs).
Gross V. Petal, ESD qualification and testing of semiconductor electronic components, Electronic Components and Technology Conference, 1996 Proceedings; May 1996, (12 pgs).

\* cited by examiner

SYSTEM AND METHOD TO PREDICT WHETHER A PROTECTION CIRCUIT IS LIKELY TO PREVENT A LATENT FAILURE WITHIN A MONITORED CIRCUIT

GOVERNMENT INTEREST

This invention was made with Government support, awarded by the Aerospace Corporation. The government has certain rights in this invention.

FIELD OF THE DISCLOSURE

The present disclosure relates to systems and methods of predicting whether a protection circuit is likely to prevent an occurrence of a latent failure within a monitored circuit.

BACKGROUND

Integrated circuits and other semiconductor devices may be used in environments where radiation may induce a high current event. For example, an integrated circuit in outer space or in an environment exposed to nuclear radiation may experience a transient voltage spike or a transient current spike (e.g., the high current event) caused by a collision of a high energy particle, such as a high energy proton or ion associated with cosmic radiation or nuclear radiation, with the integrated circuit. When the integrated circuit includes a metal-oxide-semiconductor field-effect transistor (MOSFET) circuit, such a collision may cause the integrated circuit (or a component thereof, such as an operational amplifier (op-amp)) to "latchup" or enter a latchup state. For example, in response to a high current event, power provided to the integrated circuit by one or more power sources may increase due to a portion of the integrated circuit acting as a low impedance path (e.g., a short) between the power rails of the integrated circuit during latchup. If the integrated circuit remains in the latchup state for an extended time period, the increased power provided to the integrated circuit may cause a latent failure to occur within the integrated circuit. A latent failure may indicate damage to the integrated circuit that does not cause an immediate error, and such damage is therefore difficult to detect. For example, a region of the integrated circuit may melt due to increased current flow through the integrated circuit, but the integrated circuit may not generate a detectable error until a later time.

Because the integrated circuit may not exit the latchup state fast enough to avoid an occurrence of a latent failure, an unprotected integrated circuit that is subject to latchup may be unsuitable for use in environments that are subject to high current events. One way to prevent a latent failure in an integrated circuit is to couple the integrated circuit to a protection circuit. Although the protection circuit may not prevent the occurrence of a latchup, the protection circuit may be configured to cause the integrated circuit experiencing latchup to exit latchup prior to occurrence of a latent failure. The protection circuit may be designed to cause the integrated circuit to exit latchup within a threshold time period (e.g., before component(s) of the integrated circuit melt). One or more characteristic values of the protection circuit, such as resistance values of resistors and capacitance values of capacitors, may be selected to prevent or reduce the likelihood of occurrence of a latent failure.

One method of predicting whether a protection circuit is likely to prevent the occurrence of latent failures is to perform a destructive physical analysis on the integrated circuit after a latchup event. The destructive physical analysis may include cutting the integrated circuit apart and studying the integrated circuit at a physical level to determine properties of the portion of the integrated circuit subject to latchup, such as a physical current path through the portion, an area of the portion, and a thermal volume associated with the portion. However, the destructive physical analysis is an irreversible and complex process, and may therefore be expensive and time-consuming.

SUMMARY

Particular embodiments disclosed herein provide a monitoring system configured to predict whether a protection circuit coupled to a monitored circuit is likely to prevent an occurrence of a latent failure within the monitored circuit in particular latchup conditions, without performing destructive analysis on the monitored circuit. Latchup conditions may be caused by high current events, and the monitored circuit may enter a latchup state in response to a high current event, such as a transient current or a transient voltage. When the monitored circuit enters the latchup state, a portion of the monitored circuit subject to latchup (e.g., a "latchup structure") may act as a low impedance path between power rails of the monitored circuit. Due to the low impedance path, an unprotected monitored circuit may receive an increased quantity of power from one or more power supplies that causes an occurrence of a latent failure within the unprotected monitored circuit during the high current event.

A protection circuit may be coupled between the monitored circuit and one or more power supplies to limit a quantity of power provided by one or more power supplies to the monitored circuit during a high current event. The monitored circuit may exit the latchup state when the voltage across the latchup structure falls to a latchup release voltage value, or when current flowing through the latchup structure falls to a latchup release current value. The protection circuit may be designed to limit the quantity of power provided to the monitored circuit by one or more power supplies so that the voltage (or current) of the latchup structure falls to the latchup release voltage (or current) value before a latent failure occurs. For example, one or more characteristic values of the protection circuit, such as resistance values of resistors or capacitance values of capacitors, may be selected such that the protection circuit causes the voltage or the current to fall to latchup release parameter values (e.g., the latchup release voltage value or the latchup release current value) within a threshold time period and causing the monitored circuit to exit the latchup state. When the monitored circuit exits the latchup state within the threshold time period (e.g., due to the influence of the protection circuit), the monitored circuit does not experience a latent failure.

To predict whether a particular protection circuit enables (or is likely to enable) a particular monitored circuit to exit latchup without the occurrence of a latent failure, the monitoring system may measure a plurality of latchup release parameter values (e.g., latchup release voltage values and/or latchup release current values) of the monitored circuit. For example, the monitoring system may be configured to simulate latchup-causing events (e.g., high current events) and to measure a corresponding plurality of latchup release voltage and/or current values exhibited by the monitored circuit during the simulated latchup-causing events. The monitoring system may also be configured to control an ambient temperature of the monitoring circuit and to control a quantity of power provided to the monitored circuit by the protection circuit during the simulated latchup-causing events. The monitoring system may determine a relationship between the measured latchup release parameter values, ambient temperatures, and power quantities. The monitoring system may estimate a temperature characteristic based on the relationship, where the temperature characteristic corresponds to a maximum estimated temperature of the latchup structure during a latchup event. If the temperature characteristic does not exceed a threshold temperature associated with latent failure (e.g., melting of circuit component(s)), the monitoring system outputs an indication that the protection circuit is likely to prevent latent failure in the case of latchup in the monitored circuit. If the temperature characteristic exceeds the threshold temperature, the monitoring system may output an indication that the protection circuit is not likely to prevent latent failure in the case of latchup, and a circuit designer may adjust one or more design parameters of the protection circuit before re-simulating latchup events. The monitoring system may thus enable iterative design-and-test of a protection circuit until the protection circuit is predicted to successfully prevent latent failure in a monitored circuit.

In a particular embodiment, a method includes measuring a plurality of latchup release parameter values of a monitored circuit to generate data. Each latchup release parameter value of the plurality of latchup release parameter values is associated with the monitored circuit exiting a latchup state. For example, each latchup release parameter value may correspond to an ambient temperature and to a quantity of power, and the monitored circuit may exit a latchup state associated with a particular ambient temperature and a particular quantity of power when a voltage or current of the monitored circuit reaches the corresponding latchup release parameter value. The method also includes predicting, based on the data and based on one or more characteristic values of a protection circuit coupled to the monitored circuit, whether the protection circuit is likely to prevent an occurrence of a latent failure within the monitored circuit in particular latchup conditions. For example, the monitoring system may predict whether the protection circuit is likely to prevent the occurrence of the latent failure within the monitored circuit in conditions where the monitored circuit is subject to high current events that cause latchup events associated with the monitored circuit.

In another particular embodiment, a monitoring system includes a processor and a memory. The memory stores instructions that, when executed by the processor, cause the processor to perform operations. The operations include measuring a plurality of latchup release parameter values of a monitored circuit to generate data. Each latchup release parameter value of the plurality of latchup release parameter values is associated with the monitored circuit exiting a latchup state. The operations also include predicting, based on the data and based on one or more characteristic values of a protection circuit coupled to the monitored circuit, whether the protection circuit is likely to prevent an occurrence of a latent failure within the monitored circuit in particular latchup conditions.

In another particular embodiment, a computer-readable storage device stores instructions that, when executed by a processor, cause the processor to perform operations. The operations include measuring a plurality of latchup release parameter values of a monitored circuit to generate data. Each latchup release parameter value of the plurality of latchup release parameter values is associated with the monitored circuit exiting a latchup state. The operations also include predicting, based on the data and based on one or more characteristic values of a protection circuit coupled to the monitored circuit, whether the protection circuit is likely to prevent an occurrence of a latent failure within the monitored circuit in particular latchup conditions.

The features, functions, and advantages that have been described can be achieved independently in various embodiments or may be combined in yet other embodiments, further details of which are disclosed with reference to the following description and drawings.

DETAILED DESCRIPTION

Particular embodiments of the present disclosure are described below with reference to the drawings. In the description, common features are designated by common reference numbers throughout the drawings.

To prevent the occurrence of latent failures in an integrated circuit, a protection circuit may be coupled between power rails of the integrated circuit and one or more power supplies. The protection circuit may be configured to limit a quantity of power provided to the integrated circuit by the one or more power supplies during latchup and to enable the integrated circuit to exit a latchup state before an occurrence of a latent failure (e.g., a latent failure caused by a sufficiently high quantity of power being provided to the monitored circuit during latchup). Whether or not the protection circuit is likely to be successful in preventing latent failures may depend on values of various parameters of the protection circuit (e.g., capacitance, resistance, etc.) that are chosen at design time. The present disclosure describes a monitoring system configured to predict whether or not a protection circuit is likely to prevent latent failures without having to subject the integrated circuit (i.e., the circuit being protected) to an irreversible destructive physical analysis.

Figure 1:
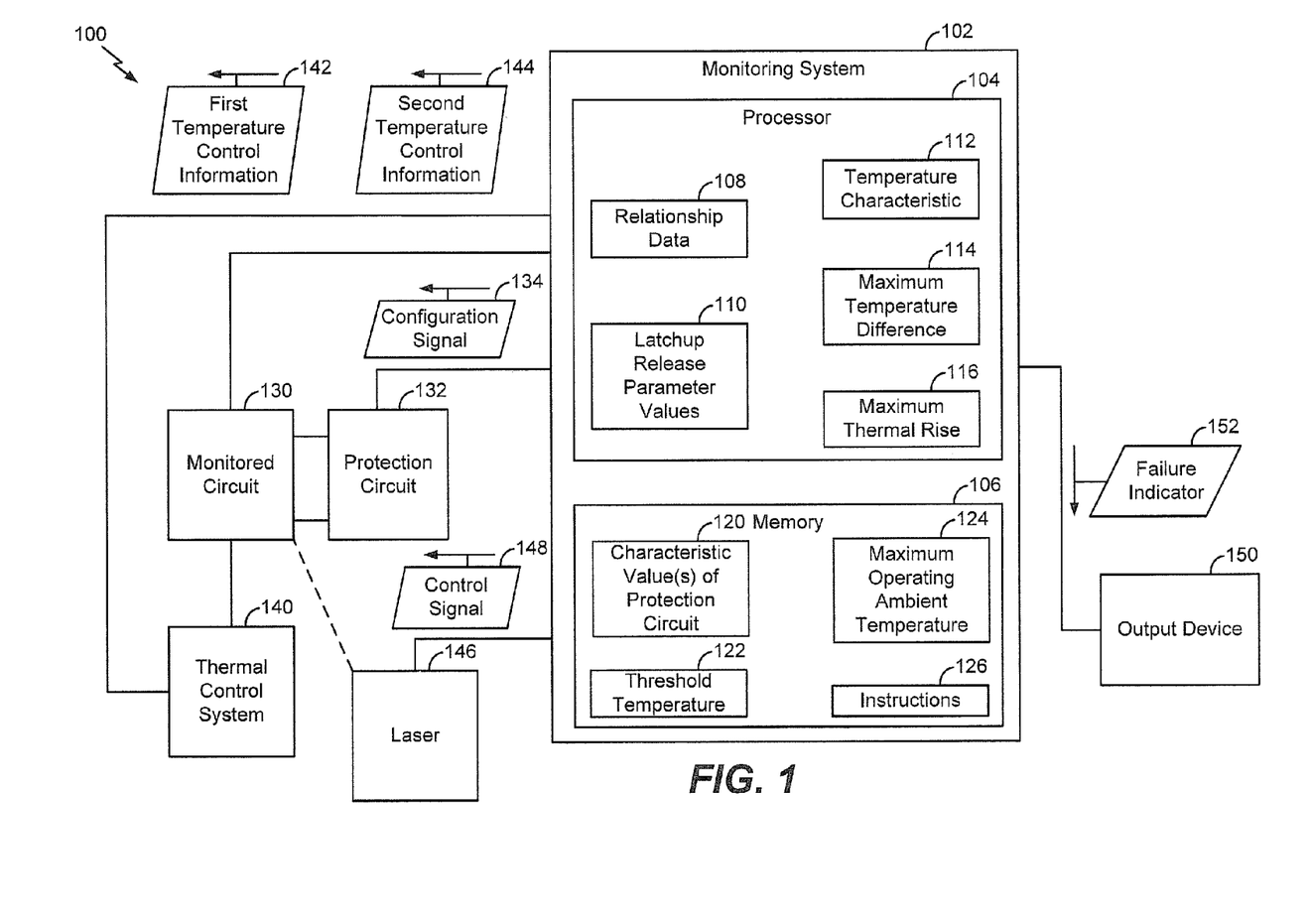
FIG. 1 is a block diagram that illustrates a particular embodiment of a system to predict whether a protection circuit is likely to prevent an occurrence of a latent failure within a monitored circuit.

FIG. 1 illustrates a system 100 including a monitoring system 102 that is configured to predict whether a protection circuit 132 is likely to prevent an occurrence of a latent failure within a monitored circuit 130 in particular latchup conditions. The particular latchup conditions may be associated with high current events. As used herein, a high current event refers to any event that induces a transient current or a transient voltage having a magnitude sufficient to cause damage to an integrated circuit, such as the monitored circuit 130. Examples of high current events may include electrostatic discharge (ESD), collisions with charged particles, or other events causing transient currents or transient voltages in the monitored circuit 130. The protection circuit 132 and the monitored circuit 130 may be intended for use in an environment subject to collisions with charged particles associated with radiation, such as cosmic radiation or nuclear radiation. A prediction that the protection circuit 132 is likely to prevent the occurrence of a latent failure within the monitored circuit 130 may correspond to a failure in time (FIT) rate associated with the monitored circuit 130 being within an acceptable range based on design parameters. For example, after a prediction that the protection circuit 132 is likely to prevent the occurrence of the latent failure within the monitored circuit 130, the protection circuit 132 and the monitored circuit 130 may be included within a platform, such as an aircraft (e.g., a fixed wing aircraft or a rotary wing aircraft), a satellite, a spacecraft, a land craft or watercraft, or another substantially self-contained structure or platform configured for use in the environment that is subject to collisions with the charged particles. Alternately, circuits designed based on the protection circuit 132 and the monitored circuit 130 (e.g., other instances of the protection circuit 132 and the monitored circuit 130) may be included within the platform.

The monitoring system 102 may include a processor 104 and a memory 106 coupled to or in communication with the processor 104. The memory 106 may store instructions 126 that are executable by the processor 104 to perform various operations, such as performing one or more calculations or communicating with one or more other elements of the system 100. The processor 104 may generate information or values based on operations performed by the processor 104, such as relationship data 108, latchup release parameter values 110, a temperature characteristic 112, a maximum temperature difference 114, and a maximum thermal rise 116. As used herein, "latchup release parameter values" refer to the latchup release voltage value or latchup release current value (e.g., voltage or current thresholds) associated with an integrated circuit exiting latchup. The processor 104 may store the information or values in a processor memory (not shown), or may store the information or values in the memory 106. The memory 106 may also store information or values used by the processor 104 to perform the operations, such as characteristic values 120 of the protection circuit 132, a threshold temperature 122, and a maximum operating ambient temperature 124. Although particular information or values are described as being stored in the processor 104 or in the memory 106, such descriptions are not limiting. Rather, any of the information or values 108-124 may be stored in the processor 104, in the memory 106, or in another memory (not shown).

The monitoring system 102 may be coupled to the monitored circuit 130. The monitored circuit 130 may include an integrated circuit or semiconductor device that is subject to latchup during high current events. As a particular example, the monitored circuit 130 may include an operational amplifier (op-amp). The monitored circuit 130 may perform one or more operations during normal operation (e.g., when the monitored circuit 130 is not in the latchup state). When the monitored circuit 130 enters the latchup state, the latchup structure may act as a low impedance path between power rails of the monitored circuit 130. For example, the latchup structure may act as a short between the power rails. Due to the latchup structure, a current flowing through the monitored circuit 130 may have a greater magnitude during a latchup event as compared to normal operation. If the monitored circuit 130 remains in the latchup state for a prolonged period of time, a latent failure may occur within the monitored circuit 130. For example, one or more dopant atoms associated with the latchup structure may migrate to a different portion of the monitored circuit 130, one or more metallization lines may melt, or other damage may occur.

The monitored circuit 130 may be coupled to the protection circuit 132 to prevent the occurrence of the latent failure during a high current event. The protection circuit 132 may be located between the monitored circuit 130 and one or more power supplies (not shown). The protection circuit 132 may cause a quantity of power provided to the monitored circuit 130 during a high current event to be sufficiently low so that the monitored circuit 130 exits latchup prior to an occurrence of a latent failure. For example, a resistor within the protection circuit 132 may dissipate a portion of power within the protection circuit 132 itself (e.g., by converting the portion of power into heat) before remaining power is provided to the monitored circuit 130 during the high current event. A resistance value of the resistor may be selected so that the quantity of power (e.g., the quantity of power after dissipation of the portion of power by the resistor) provided to the monitored circuit 130 by the one or more power supplies enables the monitored circuit 130 to exit latchup prior to an occurrence of a latent failure. In this example, the protection circuit 132 may function similarly to a voltage divider.

As another example, the quantity of power provided to the monitored circuit may be related to a capacitance value of a bypass capacitor within the protection circuit 132. The capacitance value of the bypass capacitor may be selected to be sufficiently small so that a quantity of power stored in bypass capacitor (and provided to the monitored circuit 130 during the high current event) is sufficiently small so that the monitored circuit 130 exits latchup prior to an occurrence of a latent failure. By limiting the quantity of power provided to the monitored circuit 130 during the high current event, the protection circuit 132 may cause a parameter (e.g., a voltage or current) value of the monitored circuit 130 to fall to a latchup release parameter value, thus causing the monitored circuit 130 to exit latchup without experiencing a latent failure.

The monitoring system 102 may be configured to predict whether the protection circuit 132 is likely to prevent the occurrence of the latent failure within the monitored circuit 130 based on the plurality of latchup release parameter values 110 of the monitored circuit 130. The monitoring system 102 may be configured to measure the plurality of latchup release parameter values 110 for particular test conditions (e.g., a particular maximum operating ambient temperature 124 and particular characteristic values 120 of the protection circuit 132). The monitoring system 102 may be coupled to the monitored circuit 130 in order to measure the plurality of latchup release parameter values 110. For example, the monitoring system 102 may be coupled to the monitored circuit 130 via one or more sensors or measurement devices (not shown) that are configured to measure a current flowing through the monitored circuit 130, a voltage across the monitored circuit 130 (e.g., a voltage across the power rails of the monitored circuit 130), or a combination thereof. In another example, the one or more sensors or the measurement devices may be internal to the monitoring system 102. The plurality of latchup release parameter values 110 may include a plurality of latchup release voltage values, a plurality of latchup release current values, or a combination thereof. Each latchup release parameter value of the plurality of latchup release parameter values 110 may be measured when the monitored circuit 130 exits a latchup state, as further described with reference to FIG. 2. The monitoring system 102 may generate the relationship data 108 based on the plurality of latchup release parameter values 110. The relationship data 108 may indicate a relationship between a latchup release parameter value and an ambient temperature of the monitored circuit 130 for a plurality of different quantities of power provided by the protection circuit 132, as further described herein. For example, the different quantities of power may correspond to different configurations (e.g., to different characteristic values, such as resistance values and capacitance values) of the protection circuit 132, as further described herein.

The monitoring system 102 may be coupled to the protection circuit 132. If the protection circuit 132 is dynamically adjustable (e.g., if the protection circuit 132 includes a variable resistor or a variable capacitor), the monitoring system 102 may control a quantity of power provided by the protection circuit 132 to the monitored circuit 130. For example, the monitoring system 102 may transmit a configuration signal 134 to the protection circuit 132 indicating a particular quantity of power to provide. The protection circuit 132 may be configured to change the quantity of power provided to the monitored circuit 130 based on the configuration signal 134. For example, the protection circuit 132 may be configured to change a resistance value or a capacitance value via a switch (e.g., by coupling an additional resistor or an additional capacitor to the protection circuit 132 when the switch is closed) or by changing a value of a variable resistor or variable capacitor. By changing at least one characteristic value, a configuration of the protection circuit 132 may be changed.

Alternatively, if the protection circuit 132 is not dynamically adjustable, the quantity of power provided by the protection circuit 132 to the monitored circuit 130 during a latchup event may be manually adjusted (e.g., by replacing a circuit element of the protection circuit 132 or by changing a variable circuit element of the protection circuit 132). The quantity of power may be related to the one or more characteristic values 120 of the protection circuit 132. The one or more characteristic values 120 of the protection circuit 132 may include one or more capacitance values of capacitors of the protection circuit 132, one or more resistance values of resistors of the protection circuit 132, or a combination thereof. For example, the quantity of power may be based on the one or more capacitance values and the one or more resistance values, as explained above. Data descriptive of the one or more characteristic values 120 of the protection circuit 132 may be stored in the memory 106. The protection circuit 132 may initially be configured in a first configuration (e.g., a default configuration or a configuration intended for use in the environment that is subject to high current events). The protection circuit 132 may provide a first quantity of power to the monitored circuit 130 when configured in the first configuration during a latchup event. For example, when the monitored circuit 130 enters the latchup state, the protection circuit 132 may provide the first quantity of power to the monitored circuit 130 due to discharge of one or more bypass capacitors in the protection circuit 132. At least two latchup release parameter values of the plurality of latchup release parameter values 110 may be measured when the protection circuit 132 is configured in the first configuration. For example, at least two latchup release parameter values associated with different ambient temperatures of the monitored circuit 130 may be measured when the protection circuit 132 is in the first configuration.

After determining the at least two latchup release parameter values of the plurality of latchup release parameter values 110 corresponding to the first configuration of the protection circuit 132, the protection circuit 132 may be changed to a second configuration. The second configuration may cause a different (e.g., a second) quantity of power to be provided to the monitored circuit 130 by the protection circuit 132 during a latchup event. At least two latchup release parameter values of the plurality of latchup release parameter values 110 may be measured when the protection circuit 132 is configured in the second configuration. For example, at least two latchup release parameter values associated with different ambient temperatures of the monitored circuit 130 may be measured when the protection circuit 132 is in the second configuration. Although only two configurations and two quantities of power are described, the protection circuit 132 may be configured in more than two configurations that provide more than two different quantities of power and at least two latchup release parameter values of the plurality of latchup release parameter values 110 may be measured for each of the configurations.

The monitoring system 102 may be coupled to a thermal control system 140 and may be configured to control an ambient temperature of the monitored circuit 130. The thermal control system 140 may include a heating device configured to increase the ambient temperature of the monitored circuit 130, a cooling device configured to reduce the ambient temperature of the monitored circuit 130, or a combination thereof. The monitoring system 102 may transmit first temperature control information 142 indicating a first temperature to the thermal control system 140. The thermal control system 140 may be configured to set the ambient temperature of the monitored circuit 130 at the first temperature in response to receiving the first temperature control information 142. At least two latchup release parameter values of the plurality of latchup release parameter values 110 may be measured when the ambient temperature of the monitored circuit 130 is the first temperature. For example, at least two latchup release parameter values associated with different quantities of power provided to the monitored circuit 130 may be measured when the ambient temperature is the first temperature. After measuring the at least two latchup release parameter values associated with the first temperature, the monitoring system 102 may transmit second temperature control information 144 indicating a second temperature to the thermal control system 140. The thermal control system 140 may set the ambient temperature of the monitored circuit 130 at the second temperature in response to receiving second temperature control information 144. At least two latchup release parameter values of the plurality of latchup release parameter values 110 may be measured when the ambient temperature of the monitored circuit 130 is the second temperature. For example, at least two latchup release parameter values associated with different quantities of power provided to the monitored circuit 130 may be measured when the ambient temperature is the second temperature. Although only two ambient temperatures are described, the thermal control system 140 may set the ambient temperature to more than two different ambient temperatures and at least two latchup release parameter values of the plurality of latchup release parameter values 110 may be measured at each of the ambient temperatures.

The monitoring system 102 may be coupled to a laser 146 and may be configured to initiate a simulated high current event at the monitored circuit 130. For example, the monitoring system 102 may transmit a control signal 148 to the laser 146. The laser 146 may be targeted at the monitored circuit 130 and may be configured to apply one or more energy pulses to the monitored circuit 130 to cause the simulated high current event in response to receiving the control signal 148. In a particular example, the laser 146 may be configured to direct a beam (e.g., apply an energy pulse) at the monitored circuit 130 when the control signal 148 is asserted. In another example, the control signal 148 may include settings information, such as duration of the energy pulse or magnitude of the energy pulse, and the laser 146 may be configured to direct the beam based on the settings information. The magnitude of the energy pulse may be determined based on a magnitude of a transient current caused by an expected high current event of the environment in which the monitored circuit 130 will be used. The magnitude of the energy pulse may be set sufficiently low so that a quantity of power provided to the monitored circuit 130 by the simulated high current event is negligible compared to the quantity of power provided by to the monitored circuit 130 by the protection circuit 132. The plurality of latchup release parameter values 110 may be measured during one or more simulated high current events initiated by the laser 146.

The monitoring system 102 may be configured to determine or estimate the values or information 108-116 in order to predict whether the protection circuit 132 is likely to prevent the occurrence of a latent failure within the monitored circuit 130 using the plurality of latchup release parameter values 110. As explained above, the monitoring system 102 may be configured to measure the plurality of latchup release parameter values 110 of the monitored circuit 130 to generate the relationship data 108. The plurality of latchup release parameter values 110 may include a plurality of latchup release voltage values associated with the monitored circuit 130, a plurality of latchup release current values associated with the monitored circuit 130, or a combination thereof. Measuring the plurality of latchup release parameter values 110 may include measuring a respective latchup release parameter value, such as a latchup release voltage value or a latchup release current value, associated with each of a plurality of ambient temperatures of the monitored circuit 130 and associated with each of a plurality of power quantities provided by the protection circuit 132 during a plurality of simulated high current events.

The relationship data 108 may include, for each latchup release parameter value of the plurality of latchup release parameter values 110, an associated ambient temperature of the monitored circuit 130 and an associated quantity of power. For example, the relationship data 108 may include four latchup release parameter values: a first latchup release parameter value associated with the first ambient temperature and associated with the first quantity of power, a second latchup release parameter value associated with the second ambient temperature and associated with the first quantity of power, a third latchup release parameter value associated with the first ambient temperature and associated with the second quantity of power, and a fourth latchup release parameter value associated with the second ambient temperature and the second quantity of power. Thus, at least two of the latchup release parameter values may be associated with each ambient temperature and at least two of the latchup release parameter values may be associated with each quantity of power. Although only four latchup release parameter values, two ambient temperatures, and two quantities of power are described, the relationship data 108 may include fewer than four or more than four latchup release parameter values, more than two ambient temperatures, and more than two quantities of power.

The relationship data 108 may include extrapolation data based on the plurality of latchup release parameter values 110. The monitoring system 102 may generate the extrapolation data based on a relationship between latchup release parameter values, the ambient temperature of the monitored circuit 130, and the quantity of power provided to the monitored circuit 130 by the protection circuit 132. The monitoring system 102 may generate a first extrapolated curve based on a first set of latchup release parameter values of the plurality of latchup release parameter values 110 that is associated with the first quantity of power, as further described with reference to FIG. 3. In a particular example, if only two latchup release parameter values are associated with the first quantity of power, the first extrapolated curve may be a line. In another example, if more than two latchup release parameter values are associated with the first quantity of power, the first extrapolated curve may be a curve. Using a greater number of latchup release parameter values to generate the first extrapolated curve may increase the accuracy of the first extrapolated curve. The monitoring system 102 may generate a second extrapolated curve based on a second set of latchup release parameter values of the plurality of latchup release parameter values 110 that is associated with the second quantity of power in a similar manner, as further described with reference to FIG. 3. In a particular example, if only two latchup release parameter values are associated with the second quantity of power, the second extrapolated curve may be a line. In another example, if more than two latchup release parameter values are associated with the second quantity of power, the second extrapolated curve may be a curve. Using a greater number of latchup release parameter values to generate the second extrapolated curve may increase the accuracy of the second extrapolated curve. Although the previous example describes the extrapolation data as including extrapolated curves, in other examples the extrapolation data may include one or more extrapolated latchup release parameter values associated with each of the quantities of power provided by the protection circuit 132 rather than or in addition to the extrapolated curves. For example, the extrapolated values may be estimated without actually plotting data points or generating graphs or curves.

The monitoring system 102 may be configured to determine a maximum temperature difference 114 between the protection circuit 132 in the first configuration (corresponding to the first quantity of power) and the protection circuit 132 in the second configuration (corresponding to the second quantity of power) for equal latchup release parameter values. The maximum temperature difference 114 may be a maximum difference in ambient temperature between the first extrapolated curve and the second extrapolated curve for all equal latchup release parameter values, as further described with reference to FIG. 3. For example, each latchup release parameter value may correspond to a first ambient temperature associated with the first extrapolated curve (e.g., associated with the first configuration) and to a second ambient temperature associated with the second extrapolated curve (e.g., associated with the second configuration). The maximum temperature difference 114 may be a maximum difference between the first ambient temperature and the second ambient temperature for all latchup release parameter values (extrapolated or measured). The maximum temperature difference 114 may be a maximum change in temperature ($\Delta T$) associated with a change in power ($\Delta P$) between the first quantity of power and the second quantity of power.

The monitoring system 102 may be configured to determine a maximum thermal rise 116 based on the maximum temperature difference 114 and a difference between the first quantity of power and the second quantity of power. The maximum thermal rise 116 may be a maximum thermal rise per unit of power provided to the monitored circuit 130 by the protection circuit 132 when the monitored circuit 130 is in the latchup state. The monitoring system 102 may determine the difference between the first quantity of power and the second quantity of power to determine a change in power ($\Delta P$). The monitoring system 102 may divide the maximum temperature difference 114 ($\Delta T$) by the change in power ($\Delta P$) to determine a maximum thermal rise per change in power ($\Delta T/\Delta P$). The maximum thermal rise per change in power indicates an estimated maximum increase in the ambient temperature of the monitored circuit 130 for an increase in power provided by the protection circuit 132 of one power unit. The monitoring system 102 may scale the maximum thermal rise per change in power by the first quantity of power. Thus, the maximum thermal rise 116 may be determined for the protection circuit 132 when the protection circuit 132 is configured in the first configuration. If the protection circuit 132 is intended to be configured in a different configuration for use in the environment subject to high current events, the maximum thermal rise per change in power may be scaled by a particular quantity of power associated with the different configuration. The particular quantity of power associated with the different configuration may be determined based on one or more capacitance values and one or more resistance values of the protection circuit 132 in the different configuration.

The monitoring system 102 may be configured to estimate the temperature characteristic 112 based on the maximum thermal rise 116 and based on the maximum operating ambient temperature 124 of the monitored circuit 130. The temperature characteristic 112 may be a maximum estimated temperature of the latchup structure of the monitored circuit 130 when the monitored circuit 130 is in the latchup state. The maximum operating ambient temperature 124 may be a maximum ambient temperature associated with the monitored circuit 130 during normal operation (e.g., when the monitored circuit 130 is not in the latchup state). For example, the maximum operating ambient temperature 124 may be determined based on a designed operating environment temperature, such as a temperature of an environment that the monitored circuit 130 is intended to be used in (e.g., the environment that is subject to high current events). The maximum operating ambient temperature 124 may be stored in the memory 106 or may be entered by the user via an input device (not shown). The temperature characteristic 112 may be estimated by adding the maximum thermal rise 116 to the maximum operating ambient temperature 124. The maximum thermal rise 116 may indicate a maximum increase to the ambient temperature of the latchup structure of the monitored circuit 130 due to the monitored circuit 130 dissipating the first quantity of power provided by the protection circuit 132 during latchup. Thus, the temperature characteristic 112 may indicate a worst-case temperature of the latchup structure of the monitored circuit 130 when the monitored circuit 130 is in the latchup state (e.g., an increase in temperature above the maximum operating ambient temperature 124 caused by the monitored circuit 130 dissipating the first quantity of power).

The monitoring system 102 may be configured to compare the temperature characteristic 112 to the threshold temperature 122. The threshold temperature 122 may be associated with the occurrence of the latent failure within the monitored circuit 130. For example, the threshold temperature 122 may be based on characteristics of the monitored circuit 130 (e.g., material types, area, or other characteristics). In a particular embodiment, the threshold temperature 122 is a temperature at which one or more dopant atoms migrate from the latchup structure of the monitored circuit 130 to a different portion of the monitored circuit 130. The threshold temperature 122 may be stored in the memory 106 or may be entered by the user via the input device (not shown) prior to simulation of latchup-causing events at the system 100. The monitoring system 102 may predict that the protection circuit 132 is not likely to prevent the occurrence of the latent failure within the monitored circuit 130 in response to determining that the temperature characteristic 112 exceeds the threshold temperature 122. The monitoring system 102 may predict that the protection circuit 132 is likely to prevent the occurrence of the latent failure within the monitored circuit 130 in response to determining that the temperature characteristic 112 does not exceed the threshold temperature 122.

The monitoring system 102 may be coupled to an output device 150. The output device 150 may be configured to display information to a user. For example, the output device 150 may include a monitor, a television screen, a mobile device, a computing device, or any other device capable of displaying information to the user. When the monitoring system 102 predicts that the protection circuit 132 is not likely to prevent an occurrence of a latent failure within the monitored circuit 130, the monitoring system 102 may generate a failure indicator 152. For example, the failure indicator 152 may be generated in response to the monitoring system 102 determining that temperature characteristic 112 exceeds the threshold temperature 122, as further explained herein. The monitoring system 102 may be configured to transmit the failure indicator 152 to the output device 150. The output device 150 may display information to the user indicating that the protection circuit 132 was unsuccessful in protecting the monitored circuit 130 in response to receiving the failure indicator 152. In a particular embodiment, the monitoring system 102 may transmit additional information including an estimate of a maximum ambient temperature of the portion of the monitored circuit 130 (e.g., the latchup structure) during a latchup event and the threshold temperature 122. The user may determine a course of action based on the failure indicator 152 and/or the additional information. For example, the user may adjust the one or more characteristic values 120 (e.g., resistance values of resistors and/or capacitance values of capacitors) of the protection circuit 132 until the protection circuit 132 is predicted to successfully prevent latent failure within the monitored circuit 130. As another example, the user may determine that the predicted occurrence of the latent failure within the monitored circuit 130 cannot be prevented and that the monitored circuit 130 may not be used in the environment subject to high current events.

During operation, the monitoring system 102 may measure the plurality of latchup release parameter values 110 associated with the monitored circuit 130 to generate the relationship data 108. For example, the monitoring system 102 may initiate a plurality of simulated high current events at the monitored circuit 130 via the laser 146. The monitoring system 102 may adjust an ambient temperature of the monitored circuit 130 and adjust (or prompt a user to adjust) a quantity of power provided by the protection circuit 132 via the thermal control system 140 and via the protection circuit 132, respectively, so that latchup release parameter values associated with at least two different ambient temperatures and associated with at least two different quantities of energy are measured and used to generate the relationship data 108.

The monitoring system 102 may estimate the temperature characteristic 112 based on the relationship data 108 and based on the characteristic values 120 of the protection circuit 132 (e.g., based on a quantity of power provided by the protection circuit 132 when the protection circuit 132 is configured in the first configuration). Estimating the temperature characteristic 112 may involve determining the extrapolation data, the maximum temperature difference 114, and the maximum thermal rise 116. The monitoring system 102 may compare the temperature characteristic 112 to the threshold temperature 122 to predict whether the protection circuit 132 is likely to prevent the occurrence of the latent failure within the monitored circuit 130. For example, based the plurality of latchup release parameter values 110 measured during the plurality of simulated high current events, the monitoring system 102 may determine whether the temperature characteristic 112 exceeds the threshold temperature to predict whether the protection circuit 132 is likely to prevent an occurrence of a latent failure within the monitored circuit 130 when the monitored circuit 130 is used in an environment that is subject to high current events. In response to predicting that the protection circuit 132 is not likely to prevent the occurrence of the latent failure within the monitored circuit 130 (e.g., in response to determining that the temperature characteristic 112 exceeds the threshold temperature 122), the monitoring system 102 may transmit the failure indicator 152 to the output device 150 for display to the user or as output data to be stored.

Thus, the monitoring system 102 may enable determination and quantification of information associated with occurrence of a latent failure within the monitored circuit 130 for different design considerations. For example, information associated with the occurrence of the latent failure may be quantified (e.g., determined or estimated) based on particular characteristic values 120 of the protection circuit 132 and based on a particular maximum operating ambient temperature 124. Thus, the monitoring system 102 facilitates design and verification of the protection circuit 132 (e.g., selection of the characteristic values 120 of the protection circuit 132) to enable use of the monitored circuit 130 that is subject to latchup with a prediction that a latent failure is not likely to occur within the monitored circuit 130 during latchup. Based on the prediction, the protection circuit 132 and the monitored circuit 130 may be used in an environment that is subject to high current events.

Figure 2:
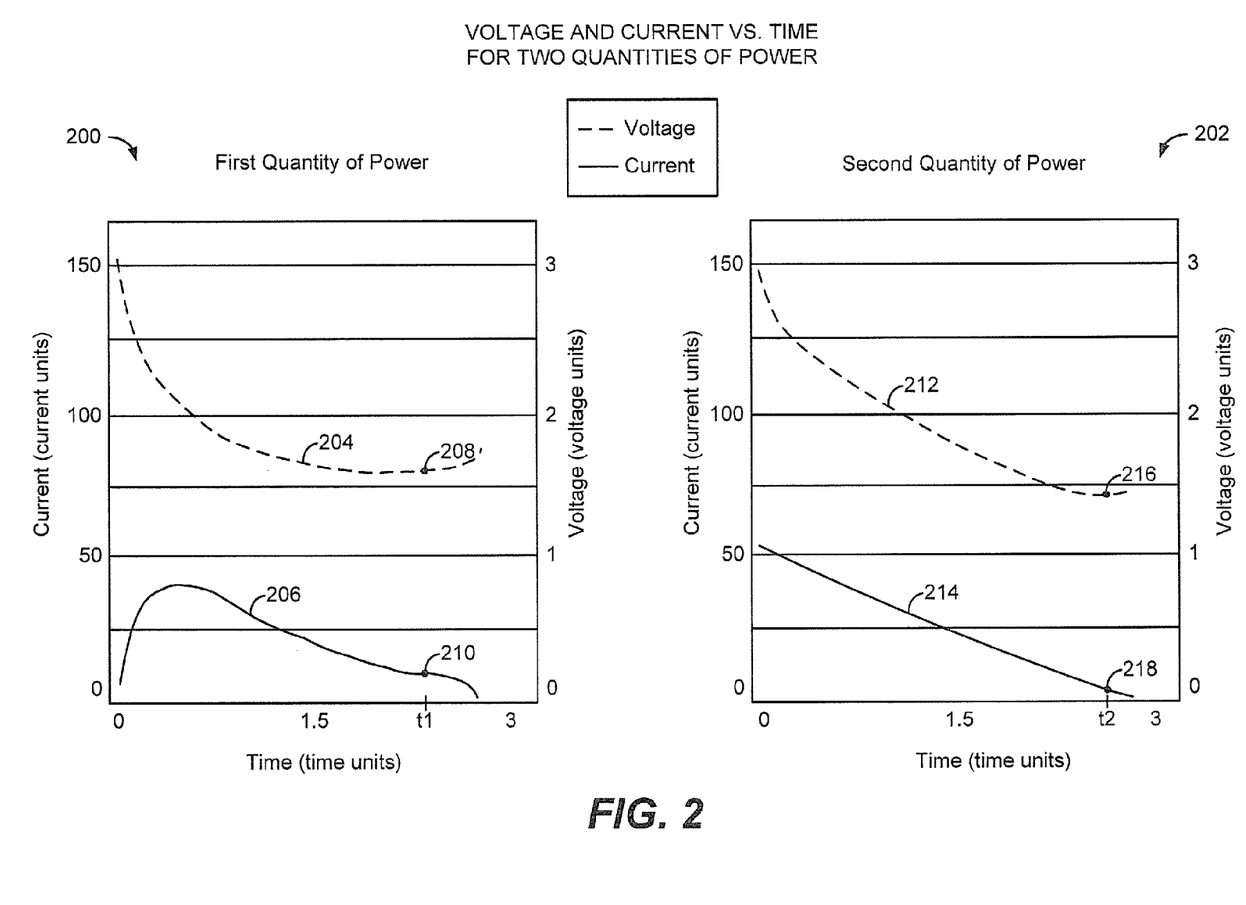
FIG. 2 is a diagram of two graphs that illustrate voltage and current measurements of a monitored circuit associated with different quantities of power provided to the monitored circuit by a protection circuit.

Referring to FIG. 2, a diagram of two illustrative graphs of voltage and current measurements of a monitored circuit associated with different quantities of power provided to the monitored circuit by a protection circuit is shown. The values illustrated in FIG. 2 are not limiting. Rather, the monitored circuit 130 may have different voltage or current measurements than shown in FIG. 2. Units in FIG. 2 may include milliamps (mA) as current units, volts (V) as voltage units, and microseconds (µs) as time units. The voltage measurements (e.g., values) and the current measurements (e.g., values) may be associated with different quantities of power provided to the monitored circuit 130 by the protection circuit 132. As explained with reference to FIG. 1, the monitoring system 102 may be configured to measure latchup release parameter values associated with at least two different quantities of power. For example, the monitoring system 102 may measure latchup release parameter values when the protection circuit 132 is configured in the first configuration associated with providing the first quantity of power. After at least two latchup release parameter values are measured, the monitoring system 102 may measure at least two latchup release parameter values when the protection circuit 132 is configured in the second configuration. Each of the latchup release parameter values may be associated with one of a plurality of ambient temperatures of the monitored circuit 130.

A first graph 200 of FIG. 2 illustrates a first voltage 204 and a first current 206 of the monitored circuit 130 during a first time period associated with a latchup state of the monitored circuit 130. The first voltage 204 and the first current 206 may be associated with the first quantity of power provided to the monitored circuit 130 by the protection circuit 132. The monitored circuit 130 may exit the latchup state when the first voltage 204 decreases to a first latchup release voltage value 208. The first voltage 204 may be equal to the first latchup release voltage value 208 at a first time t1. The first latchup release voltage value 208 may correspond to a point at which a rate of change of the first voltage 204 (e.g., a slope of a first curve of the first voltage 204) is zero just before the rate of change of the first voltage 204 starts to increase (where the slope of the first curve becomes positive) indicating a change in the current load of the monitored circuit 130. In a particular embodiment, the first latchup release voltage value 208 may be a minimum die voltage of the monitored circuit 130 that is sustained when a bypass capacitor of the protection circuit 132 starts to recharge after a discharge caused by the monitored circuit 130 entering the latchup state. A first latchup release current value 210 may be a current value of the first current 206 when the first voltage 204 is equal to the first latchup release voltage value 208. For example, the first latchup release current value 210 may be a value of the first current 206 at the first time t1. The monitored circuit 130 may exit the latchup state when the first current 206 decreases to the first latchup release current value 210. The first latchup release voltage value 208 and the first latchup release current value 210 may have a value just below a holding voltage value (e.g., a minimum voltage value for which the monitored circuit 130 remains in the latchup state) or a holding current value (e.g., a minimum current value for which the monitored circuit 130 remains in the latchup state), respectively, and the first latchup release voltage value 208 and the first latchup release current value 210 may be used to estimate the holding voltage value and the holding current value.

A second graph 202 of FIG. 2 illustrates a second voltage 212 and a second current 214 of the monitored circuit 130 during a second time period associated with a latchup state of the monitored circuit 130. The second voltage 212 and the second current 214 may be associated with the second quantity of power provided to the monitored circuit 130 by the protection circuit 132. The monitored circuit 130 may exit the latchup state when the second voltage 212 decreases to a second latchup release voltage value 216. The second voltage 212 may be equal to the second latchup release voltage value 216 at a second time t2. The second latchup release voltage value 216 may correspond to a point at which a rate of change of the second voltage 212 (e.g., a slope of a second curve of the second voltage 212) is zero just before the rate of change of the second voltage 212 starts to increase (where the slope of the second curve becomes positive) indicating a change in the current load of the monitored circuit 130. In a particular embodiment, the second latchup release voltage value 216 may be a minimum die voltage of the monitored circuit 130 that is sustained when a bypass capacitor of the protection circuit 132 starts to recharge after a discharge of the bypass capacitor caused by the monitored circuit 130 entering the latchup state. A second latchup release current value 218 may be a current value of the second current 214 when the second voltage 212 is equal to the second latchup release voltage value 216. For example, the second latchup release current value 218 may be a value of the second current 214 at the second time t2. The monitored circuit 130 may exit the latchup state when the second current 214 decreases to the second latchup release current value 218. The second latchup release voltage value 216 and the second latchup release current value 218 may have a value just below a holding voltage value or a holding current value, respectively, and the second latchup release voltage value 216 and the second latchup release current value 218 may be used to estimate the holding voltage value and the holding current value.

As illustrated in the graphs 200 and 202, the first latchup release voltage value 208 may be different from the second latchup release voltage value 216, and the first latchup release current value 210 may be different from the second latchup release current value 218. These differences may occur because latchup release parameter values are dependent on both the ambient temperature of the monitored circuit 130 and the quantity of power provided to the monitored circuit 130 by the protection circuit 132 when the monitored circuit 130 is in the latchup state. Thus, the plurality of latchup release parameter values 110 includes latchup release parameter values associated with at least two different quantities of power such that the relationships between the latchup release parameter values, the ambient temperature of the monitored circuit 130, and the quantity of power provided to the monitored circuit 130 by the protection circuit 132 may be determined.

Figure 3:
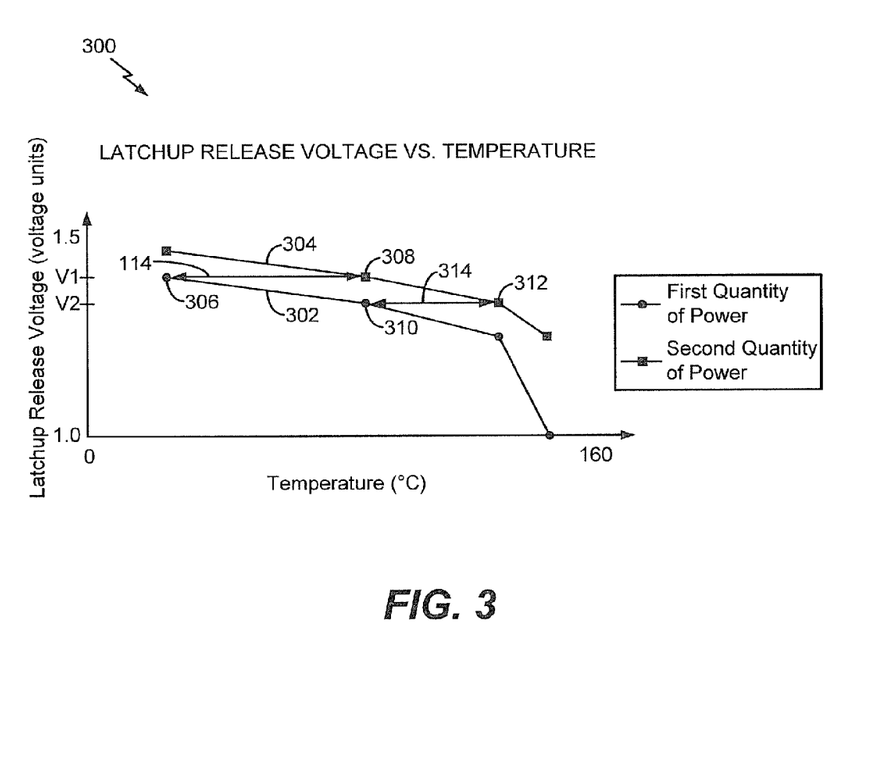
FIG. 3 is a graph that illustrates latchup release voltage values and ambient temperatures of a monitored circuit associated with different quantities of power provided to the monitored circuit by a protection circuit.

Referring to FIG. 3, an illustrative graph 300 of latchup release voltage values and ambient temperatures of the monitored circuit 130 associated with different quantities of power provided to the monitored circuit by a protection circuit. The graph 300 may be a graphical representation of the relationship data 108 of FIG. 1. The values illustrated in FIG. 3 are not limiting. Rather, the monitored circuit 130 may have different latchup release voltage values or ambient temperatures than shown in FIG. 3. Units of the graph 300 may include volts (V) as voltage units and degrees Celsius (° C.) as temperature units. A first curve 302 is associated with the first quantity of power provided to the monitored circuit 130 by the protection circuit 132. For example, latchup release voltage values of the first curve 302 may be measured at various ambient temperatures when the protection circuit 132 is configured in the first configuration. A second curve 304 is associated with the second quantity of power provided to the monitored circuit 130 by the protection circuit 132. For example, latchup release voltage values of the second curve 304 may be measured at various ambient temperatures when the protection circuit 132 is configured in the second configuration. The first curve 302 and the second curve 304 may illustrate extrapolated values that are extrapolated based on the latchup release voltage values associated with the corresponding quantity of power. For example, the first curve 302 may represent a best fit curve or a best fit line applied to the latchup release voltage values associated with the first quantity of power, and the second curve 304 may represent a best fit curve or a best fit line applied to the latchup release voltage values associated with the second quantity of power.

As described with reference to FIG. 1, the monitoring system 102 may determine the maximum temperature difference 114 between the first curve 302 and the second curve 304 for use in determining the maximum thermal rise 116. The maximum temperature difference 114 may represent a maximum difference between a corresponding ambient temperature of the first curve 302 (associated with the first quantity of power) and a corresponding ambient temperature of the second curve 304 (associated with the second quantity of power) for all latchup release parameter values (extrapolated or measured). The maximum temperature difference 114 may be illustrated in FIG. 3 as the greatest horizontal distance (e.g., temperature difference) between a first point on the first curve 302 corresponding to a particular latchup release voltage value and a second point on the second curve 304 corresponding to the same latchup release voltage value. For example, for each latchup release voltage value, a temperature difference between the first curve 302 and the second curve 304 may be determined. The maximum temperature difference 114 may be a maximum of the temperature differences determined in this manner. In another example, a particular latchup release voltage value associated with the maximum temperature difference 114 may be determined based on an analysis of the first curve 302 and the second curve 304, and only the maximum temperature difference 114 associated with the particular latchup release voltage value may be determined (e.g., temperature differences for other latchup release voltage values may not be determined).

In FIG. 3, the maximum temperature difference 114 for equal latchup release voltage values may be illustratively determined to correspond to a temperature difference associated with latchup release voltage V1 (e.g., at latchup release voltage V1, the temperature difference between the first curve 302 and the second curve 304 may be greater than at any other latchup release voltage). For example, the maximum temperature difference 114 may be the temperature difference between a first ambient temperature 306 of the first curve 302 at V1 and a second ambient temperature 308 of the second curve 304 at V1. As illustrated in FIG. 3, the maximum temperature difference between the first ambient temperature 306 and the second ambient temperature 308 may be greater than a second temperature difference 314 between a third ambient temperature 310 of the first curve 302 at latchup release voltage value V2 and a fourth ambient temperature 312 of the second curve 304 at V2. The maximum temperature difference 114 may be greater than all other temperature differences between the first curve 302 and the second curve 304 for any other latchup release voltage value. In FIG. 3, V1 may be approximately 1.34 v, the first ambient temperature 306 may be approximately 25° C., and the second ambient temperature 308 may be approximately 85° C. Thus, in FIG. 3, the maximum temperature difference 114 may be 60° C. (e.g., 85° C.−25° C.).

The maximum temperature difference 114 may be scaled to determine the maximum thermal rise 116 based on the difference between the first quantity of power and the second quantity of power. The maximum temperature difference 114 may also be scaled based on the first quantity of power (e.g., a quantity of power associated with a configuration of the protection circuit 132 for which the monitoring system 102 is providing the prediction of latent failure occurrence). In FIG. 3, the protection circuit 132 provides 85 mW (the first quantity of power) to the monitored circuit 130 when in the first configuration, and the protection circuit 132 provides 160 mW (the second quantity of power) to the monitored circuit 130 when in the second configuration. In this example, the difference between the quantities of power is 75 mW. A maximum thermal rise per change in power ($\Delta T/\Delta P$) is determined by dividing the maximum temperature difference 114 by the difference between quantities of power (60° C./75 mW), which results in a ΔT/ΔP of 0.8° C./mW. The ΔT/ΔP (0.8° C./mW) may be scaled by the first quantity of power (85 mW), resulting in the maximum thermal rise 116 of 68° C. (85 mW*0.8° C./mW) associated with the first configuration of the protection circuit 132. As explained with reference to FIG. 1, the maximum thermal rise 116 (68° C.) may be added to a maximum operating ambient temperature (e.g., 85° C.) to determine the temperature characteristic 112 (153° C.). The temperature characteristic 112 may be compared to the threshold temperature 122 to predict whether the protection circuit 132 is likely to prevent an occurrence of a latent failure within the monitored circuit 130. For example, the threshold temperature 122 may be associated with a temperature at which metallization lines in the monitored circuit 130 melt (e.g., 660° C. for aluminum metallization lines) or a temperature at which dopant atoms migrate from the latchup structure to another portion of the monitored circuit 130.

Figure 4:
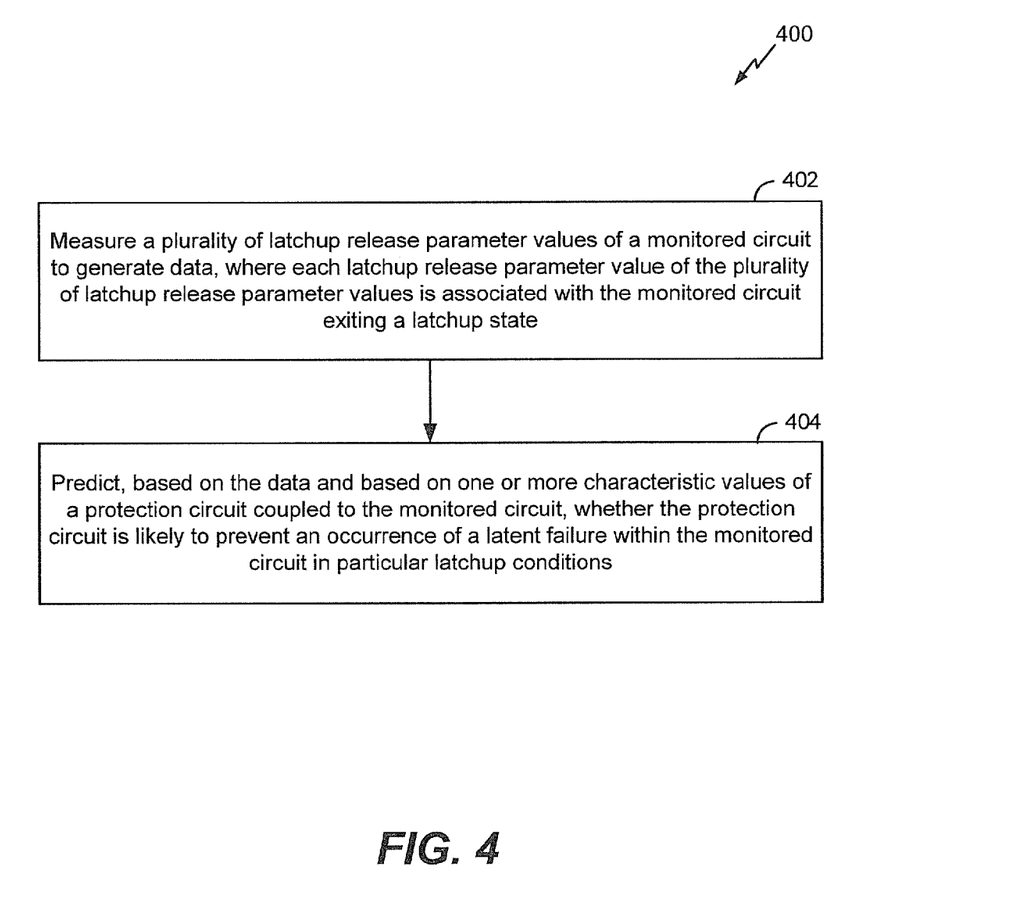
FIG. 4 is a flow diagram that illustrates a particular embodiment of a method of predicting whether a protection circuit is likely to prevent an occurrence of a latent failure within a monitored circuit.

FIG. 4 is a flow chart illustrating a particular embodiment of a method 400 of predicting whether a protection circuit is likely to prevent an occurrence of a latent failure within a monitored circuit in particular latchup conditions. The protection circuit may include the protection circuit 132 of FIG. 1, and the monitored circuit may include the monitored circuit 130 of FIG. 1. The method 400 may be performed by the monitoring system 102 of FIG. 1.

The method 400 includes measuring a plurality of latchup release parameter values of the monitored circuit to generate data, at 402. The plurality of latchup release parameter values may include the plurality of latchup release parameter values 110 of FIG. 1, and the data may include the relationship data 108 of FIG. 1. Each latchup release parameter value of the plurality of latchup release parameter values may be associated with the monitored circuit exiting a latchup state. For example, a high current event may cause the monitored circuit to enter the latchup state, and the monitored circuit may exit the latchup state when a measured parameter decreases to a latchup release parameter value, such as when a voltage across the monitored circuit decreases to a latchup release voltage value or when a current flowing through the monitored circuit decreases to a latchup release current value.

The method 400 includes predicting, based on the data and based on one or more characteristic values of a protection circuit coupled to the monitored circuit, whether the protection circuit is likely to prevent an occurrence of a latent failure within the monitored circuit in particular latchup conditions, at 404. The one or more characteristic values may include the characteristic values 120 of FIG. 1, and the protection circuit may include the protection circuit 132 of FIG. 1. The one or more characteristic values may include one or more resistance values, one or more capacitance values, or a combination thereof, associated with the protection circuit. The particular latchup conditions may be associated with a particular environment, such as high current events caused by collisions with charged particles, and the high current events may be simulated in the monitored circuit by a laser.

In order to predict whether the protection circuit is likely to prevent the occurrence of the latent failure within the monitored circuit, a temperature characteristic associated with a portion of the monitored circuit may be estimated based on the data and based on a quantity of power provided to the monitored circuit by the protection circuit. The portion of the monitored circuit may correspond to a latchup structure that acts as a low impedance path between power rails of the monitored circuit when the monitored circuit enters the latchup state. The quantity of power may be based on the one or more characteristic values of the protection circuit (e.g., based on resistance values, capacitance values, or a combination thereof). For example, the quantity of power may be a first quantity of power provided by the protection circuit when the protection circuit is configured in a first configuration. The temperature characteristic may be a maximum estimated temperature of the portion of the monitored circuit when the monitored circuit is in the latchup state. For example, the temperature characteristic may be the temperature characteristic 112 of FIG. 1. The temperature characteristic may be estimated based on a thermal rise associated with the portion of the monitored circuit and based on a maximum operating ambient temperature of the monitored circuit. The thermal rise may be the maximum thermal rise 116 of FIG. 1 and the maximum operating ambient temperature may be the maximum operating ambient temperature 124 of FIG. 1. The thermal rise may be determined based on the data and based on the quantity of power (e.g., based on the one or more characteristic values of the protection circuit).

The temperature characteristic may be compared to a threshold temperature. The threshold temperature may be the threshold temperature 122 of FIG. 1, and may be associated with the occurrence of the latent failure within the monitored circuit. A prediction that the protection circuit is not likely to prevent the occurrence of the latent failure may be based on a determination that the temperature characteristic exceeds the threshold temperature, and a prediction that the protection circuit is likely to prevent the occurrence of the latent failure may be based on a determination that the temperature characteristic does not exceed the threshold temperature. The one or more characteristic values of the protection circuit may be adjusted based on the prediction that the protection circuit is not likely to prevent the occurrence of the latent failure within the monitored circuit. For example, one or more resistors or capacitors in the protection circuit may be adjusted or replaced to attempt to identify particular characteristic values that enable the protection circuit to prevent the occurrence of the latent failure within the monitored circuit.

Thus, the method 400 enables determination and quantification of information associated with occurrence of a latent failure within a monitored circuit for different design considerations (e.g., design considerations associated with particular characteristic values of the protection circuit and associated with particular maximum operating ambient temperature of the monitored circuit). Thus, the method 400 facilitates design and verification of the protection circuit (e.g., the one or more characteristic values of the protection circuit) to enable use of the monitored circuit that is subject to latchup based on an prediction that a latent failure is not likely to occur within the monitored circuit during latchup. Additionally, the method 400 does not require performing a destructive physical analysis of the monitored circuit.

The method 400 of FIG. 4 may be initiated or controlled by a field-programmable gate array (FPGA) device, an application-specific integrated circuit (ASIC), a processing unit, such as a central processing unit (CPU), a digital signal processor (DSP), a controller, another hardware device, a firmware device, or any combination thereof. As an example, the method 400 of FIG. 4 can be initiated or controlled by one or more processors, such as the processor 104 of FIG. 1.

Figure 5:
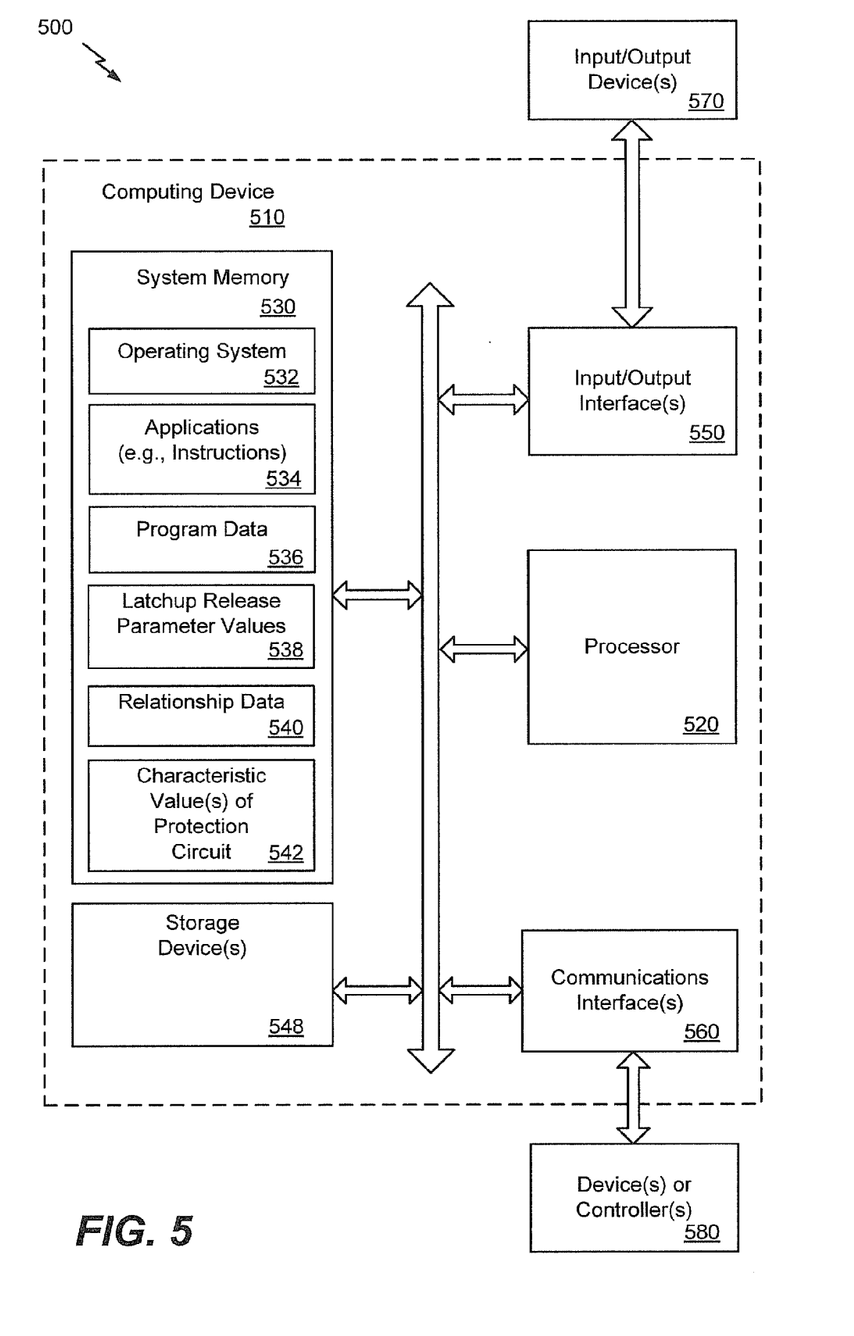
FIG. 5 is a block diagram that illustrates a particular embodiment of a computing system to predicting whether a protection circuit is likely to prevent an occurrence of a latent failure with a monitored circuit.

FIG. 5 is a block diagram of a computing environment 500 including a computing device 510 operable to predict whether a protection circuit is likely to prevent an occurrence of a latent failure within a monitored circuit during particular latchup conditions. For example, the computing device 510 may be included within or correspond to the monitoring system 102 of FIG. 1.

The computing device 510 may include at least one processor 520. Within the computing device 510, the at least one processor 520 may communicate with a system memory 530, one or more storage devices 548, one or more input/output interfaces 550, one or more communications interfaces 560, or a combination thereof.

The system memory 530 may include volatile memory devices (e.g., random access memory (RAM) devices), nonvolatile memory devices (e.g., read-only memory (ROM) devices, programmable read-only memory, and flash memory), or both. The system memory 530 may include an operating system 532, which may include a basic input/output system for booting the computing device 510 as well as a full operating system to enable the computing device 510 to interact with users, other programs, and other devices. The system memory 530 may also include one or more applications (e.g., instructions) 534, program data 536, latchup release parameter values 538, relationship data 540, and characteristic values 542 of a protection circuit. The program data 536 may include data used by the applications 534 to perform respective functions of the applications 534. The applications 534 may include instructions executable by the at least one processor 520 to predict whether the protection circuit is likely to prevent the occurrence of the latent failure within the monitored circuit in particular latchup conditions. The latchup release parameter values 538 may include one or more latchup release voltage values and one or more latchup release current values. The relationship data 540 may include the latchup release parameter values 538, a plurality of ambient temperatures, and a plurality of quantities of power provided to the monitored circuit by the protection circuit, and may indicate a relationship between latchup release parameter value and ambient temperature for each quantity of power. The characteristic values 542 of the protection circuit may include one or more resistance values of resistors in the protection circuit, one or more capacitance values of capacitors in the protection circuit, or a combination thereof.

The one or more storage devices 548 may include nonvolatile storage devices, such as magnetic disks, optical disks, or flash memory devices. The storage devices 548 may include both removable and non-removable memory devices. In a particular embodiment, the storage devices 548 may be configured to store the operating system 532, the applications 534, the program data 536, the latchup release parameter values 538, the relationship data 540, the characteristic values 542 of the protection circuit, or a combination thereof. The system memory 530 and the storage devices 548 are physical devices and are not a signal.

In a particular embodiment, the at least one processor 520 is configured to execute computer executable instructions, such as the applications 534, stored at the system memory 530. The instructions may be executable to cause the at least one processor 520 to perform operations. The operations may include measuring a plurality of the latchup release parameter values 538 of the monitored circuit to generate the relationship data 540. Each latchup release parameter value of the plurality of the latchup release parameter values 538 may be associated with the monitored circuit exiting a latchup state. The operations may include predicting, based on the relationship data 540 and based on one or more of the characteristic values 542 of the protection circuit coupled to the monitored circuit, whether the protection circuit is likely to prevent an occurrence of a latent failure within the monitored circuit in particular latchup conditions.

The one or more input/output interfaces 550 may enable the computing device 510 to communicate with one or more input/output devices 570 to facilitate user interaction. For example, the one or more input/output interfaces 550 may be adapted to receive input from a user, to receive input from another computing device, or a combination thereof. The input/output interfaces 550 may conform to one or more standard interface protocols, including serial interfaces (e.g., universal serial bus (USB) interfaces or Institute of Electrical and Electronics Engineers (IEEE) interface standards), parallel interfaces, display adapters, audio adapters, or custom interfaces. The input/output devices 570 may include user interface devices and displays, including some combination of buttons, keyboards, pointing devices, displays, speakers, microphones, touch screens, and other devices. The processor 520 may detect interaction events based on user input received via the input/output interfaces 550. Additionally, the processor 520 may send a display to a display device via the input/output interfaces 550.

The one or more communications interfaces 560 may enable the computing device 510 to communicate with one or more other computing devices or controllers 580. The one or more communications interfaces 560 may include wired Ethernet interfaces, Institute of Electrical and Electronics Engineers (IEEE) 802 wireless interfaces, Bluetooth communication interfaces, electrical (or power line) interfaces, optical or radio frequency interfaces, or other wired or wireless interfaces. The other computer devices or controllers 580 may include host computers, servers, workstations, portable computers, telephones, tablet computers, or any other communication device or component. For example, the other computer devices or controllers 580 may include controllers or devices associated with the thermal control system 140 of FIG. 1, the laser 146 of FIG. 1, the protection circuit 132 of FIG. 1, or a combination thereof.

Examples described above illustrate but do not limit the disclosure. It should also be understood that numerous modifications and variations are possible in accordance with the principles of the present disclosure. Accordingly, the scope of the disclosure is defined by the following claims and their equivalents.

The illustrations of the examples described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than shown in the figures or one or more method steps may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. As the following claims reflect, the claimed subject matter may be directed to less than all of the features of any of the disclosed examples.

What is claimed is:

1. A method comprising:
measuring, using one or more sensors of a monitoring system, a plurality of latchup release parameter values of a monitored circuit to generate data indicative of one or more relationships between the plurality of latchup release parameter values and one or more quantities of power provided to the monitored circuit, wherein each latchup release parameter value is associated with the monitored circuit exiting a latchup state;
predicting, at a processor, whether a protection circuit coupled to the monitored circuit is likely to prevent an occurrence of a latent failure within the monitored circuit in particular latchup conditions by determining, at the processor based on the data and based on one or more characteristic values of the protection circuit, an estimated characteristic value of a latchup structure of the monitored circuit, the estimated characteristic value of the latchup structure of the monitored circuit determined based on a threshold time period for the latchup structure of the monitored circuit exiting the latchup state, the one or more characteristic values comprises a resistance value of the protection circuit, a capacitance value of the protection circuit, or a combination thereof; and
based on the estimated characteristic value satisfying a threshold, transmitting a configuration signal to the protection circuit to protect the monitored circuit, the configuration signal causing adjustment of the resistance value of the protection circuit, the capacitance value of the protection circuit, or a combination thereof.

2. The method of claim 1, wherein the plurality of latchup release parameter values comprises a plurality of latchup release voltage values associated with different ambient temperatures of the monitored circuit and associated with different quantities of power.

3. The method of claim 1, wherein the plurality of latchup release parameter values comprises a plurality of latchup release current values associated with different ambient temperatures of the monitored circuit and associated with different quantities of power provided to the monitored circuit.

4. The method of claim 1, wherein the estimated characteristic value comprises a temperature characteristic associated with a portion of the monitored circuit, wherein the threshold comprises a threshold temperature, and further comprising comparing the temperature characteristic to the threshold temperature associated with a duration of the threshold time period.

5. The method of claim 4, wherein the predicting includes:
controlling an ambient temperature of the monitored circuit, controlling a quantity of power provided to the monitored circuit by the protection circuit, or a combination thereof;
simulating a transient current, a transient voltage, or a combination thereof;
in response to the simulation of the transient current, the transient voltage, or the combination thereof, measuring corresponding plurality of latchup release voltage values, plurality of latchup release current values, or both, exhibited by the monitored circuit; and
outputting an indication as to whether the protection circuit is likely to prevent latent failure in the monitored circuit during a latchup that occurs at a second time later than the simulation at a first time or whether the protection circuit is not likely to prevent latent failure in the monitored circuit during the latchup that occurs at the second time later than the simulation at the first time.

6. The method of claim 4, further comprising, prior to predicting that the protection circuit is not likely to prevent the occurrence of the latent failure, determining that the temperature characteristic exceeds the threshold temperature.

7. The method of claim 4, wherein the temperature characteristic comprises a maximum estimated temperature of the portion of the monitored circuit.

8. The method of claim 4, wherein the temperature characteristic is estimated based on a maximum operating ambient temperature of the monitored circuit and a thermal rise per unit of power provided to the monitored circuit.

9. The method of claim 1, wherein the estimated characteristic value comprises a maximum characteristic value estimated to occur during the threshold time period.

10. A monitoring system comprising:
one or more sensors configured to measure a plurality of latchup release parameter values of a monitored circuit to generate data indicative of one or more relationships between the plurality of latchup release parameter values and one or more quantities of power provided to the monitored circuit, wherein each latchup release parameter value of the plurality of latchup release parameter values is associated with the monitored circuit exiting a latchup state;
a processor; and
a memory storing instructions that, when executed by the processor, cause the processor to perform operations comprising:
predicting whether a protection circuit coupled to the monitored circuit is likely to prevent an occurrence of a latent failure within the monitored circuit in particular latchup conditions by determining, based on the data and based on one or more characteristic values of the protection circuit, an estimated characteristic value of a latchup structure of the monitored circuit, the estimated characteristic value of the latchup structure of the monitored circuit determined based on a threshold time period for the latchup structure of the monitored circuit exiting the latchup state, the one or more characteristic values comprises a resistance value of the protection circuit, a capacitance value of the protection circuit, or a combination thereof; and
based on the estimated characteristic value satisfying a threshold, initiating transmission of a configuration signal to the protection circuit to protect the monitored circuit, the configuration signal causing adjustment of the resistance value of the protection circuit, the capacitance value of the protection circuit, or a combination thereof.

11. The monitoring system of claim 10, further comprising a thermal control system coupled to the monitored circuit and configured to set an ambient temperature of the monitored circuit, wherein the operations further comprise initiating transmission of first temperature control information to the thermal control system to set the ambient temperature, and wherein at least two latchup release parameter values of the plurality of latchup release parameter values are measured when the ambient temperature is a first temperature.

12. The monitoring system of claim 11, wherein the operations further comprise initiating transmission of second temperature control information to the thermal control system to change the ambient temperature from the first temperature to a second temperature, and wherein at least two latchup release parameter values of the plurality of latchup release parameter values are measured when the ambient temperature is the second temperature.

13. The monitoring system of claim 10, further comprising circuitry configured to:
cause the protection circuit to be configured to provide a first quantity of power to the monitored circuit during a first latchup event, wherein a first set of latchup release parameter values of the plurality of latchup release parameter values is measured when the protection circuit provides the first quantity of power; and
cause the protection circuit to be configured to provide a second quantity of power to the monitored circuit during a second latchup event, wherein a second set of latchup release parameter values of the plurality of latchup release parameter values is measured when the protection circuit provides the second quantity of power.

14. The monitoring system of claim 10, wherein the operations further comprise determining a maximum temperature difference associated with equal latchup release parameter values between a first extrapolated curve and a second extrapolated curve, wherein the first extrapolated curve is based on a first set of latchup release parameter values of the plurality of latchup release parameter values associated with a first quantity of power provided by the protection circuit, and wherein the second extrapolated curve is based on a second set of latchup release parameter values of the plurality of latchup release parameter values associated with a second quantity of power provided by the protection circuit.

15. The monitoring system of claim 14, wherein the operations further comprise:
determining a maximum thermal rise associated with the first quantity of power by scaling the maximum temperature difference based on the first quantity of power and a difference between the first quantity of power and the second quantity of power; and
estimating a maximum estimated temperature of a portion of the monitored circuit based on the maximum thermal rise and a maximum operating ambient temperature of the monitored circuit, wherein the occurrence of the latent failure is predicted when the maximum estimated temperature exceeds a threshold temperature associated with the occurrence of the latent failure.

16. A computer-readable storage device storing instructions that, when executed by a processor, cause the processor to perform operations comprising:
obtaining, from one or more sensors, a plurality of latchup release parameter values of a monitored circuit to generate data indicative of one or more relationships between the plurality of latchup release parameter values and one or more quantities of power provided to the monitored circuit, wherein each latchup release parameter value of the plurality of latchup release parameter values is associated with the monitored circuit exiting a latchup state;
predicting whether a protection circuit coupled to the monitored circuit is likely to prevent an occurrence of a latent failure within the monitored circuit in particular latchup conditions by determining, based on the data and based on one or more characteristic values of the protection circuit, an estimated characteristic value of a latchup structure of the monitored circuit, the estimated characteristic value of the latchup structure of the monitored circuit determined estimated based on a threshold time period for the latchup structure of the monitored circuit exiting the latchup state, the one or more characteristic values comprises a resistance value of the protection circuit, a capacitance value of the protection circuit, or a combination thereof; and
based on the estimated characteristic value satisfying a threshold, initiating transmission of a configuration signal to the protection circuit to protect the monitored circuit, the configuration signal causing adjustment of the resistance value of the protection circuit, the capacitance value of the protection circuit, or a combination thereof.

17. The computer-readable storage device of claim 16, wherein the configuration signal is a control signal to a laser, wherein the laser is configured to apply a plurality of energy pulses to the monitored circuit to cause a plurality of simulated high current events based on the control signal, and wherein each latchup release parameter value of the plurality of latchup release parameter values is measured during one of the simulated high current events.

18. The computer-readable storage device of claim 16, wherein the data indicates a particular relationship between the plurality of latchup release parameter values, ambient temperature of the monitored circuit, and a quantity of power provided to the monitored circuit by the protection circuit.

19. The computer-readable storage device of claim 16, wherein the plurality of latchup release parameter values comprises a plurality of latchup release voltage values, and wherein each latchup release voltage value of the plurality of latchup release voltage values is measured when a rate of change of a voltage across the monitored circuit is zero.

20. The computer-readable storage device of claim 16, wherein the relationship indicates, for each of a plurality of temperatures, a corresponding latchup release voltage for a particular quantity of power, and wherein the operations further comprise generating a failure indicator in response to predicting that the protection circuit is not likely to prevent the occurrence of the latent failure.

* * * * *